US012396268B2

(12) United States Patent
Galagan et al.

(10) Patent No.: US 12,396,268 B2
(45) Date of Patent: Aug. 19, 2025

(54) PHOTOVOLTAIC DEVICE AND METHOD OF MANUFACTURING THE SAME

(71) Applicant: Nederlandse Organisatie voor toegepast-natuurwetenschappelijk onderzoek TNO, 's-Gravenhage (NL)

(72) Inventors: Yulia Galagan, Tapei (TW); Herbert Lifka, Eindhoven (NL); Henri Fledderus, Eindhoven (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 534 days.

(21) Appl. No.: 17/624,150

(22) PCT Filed: Jul. 8, 2020

(86) PCT No.: PCT/NL2020/050444
§ 371 (c)(1),
(2) Date: Dec. 30, 2021

(87) PCT Pub. No.: WO2021/006731
PCT Pub. Date: Jan. 14, 2021

(65) Prior Publication Data
US 2022/0352402 A1  Nov. 3, 2022

(30) Foreign Application Priority Data

Jul. 10, 2019 (EP) ..................... 19185397

(51) Int. Cl.
*H10F 19/37* (2025.01)
*H10F 77/20* (2025.01)
(52) U.S. Cl.
CPC ........... *H10F 19/37* (2025.01); *H10F 77/211* (2025.01)

(58) Field of Classification Search
CPC ........ H10F 19/80; H10F 19/37; H10F 77/488; H10F 77/484; H10F 77/211
See application file for complete search history.

(56) References Cited

U.S. PATENT DOCUMENTS 9,793,061 B2 * 10/2017 Gardner ................. H01G 11/52
10,644,179 B1 * 5/2020 Bush ...................... H10K 30/82
(Continued)

FOREIGN PATENT DOCUMENTS

EP          3435424 A1    1/2019
WO    WO 2012/043539 A1   4/2012
(Continued)

OTHER PUBLICATIONS

European Patent Office, International Search Report in corresponding International Application No. PCT/NL2020/050444, dated Sep. 4, 2020 (3 pages).
(Continued)

*Primary Examiner* — Zandra V Smith
*Assistant Examiner* — John M Parker
(74) *Attorney, Agent, or Firm* — Leydig, Voit & Mayer, Ltd.

(57) ABSTRACT

A photovoltaic device (1) with a plurality of photovoltaic modules (1A, IB, ..., IF), is disclosed herein comprising a stack with a primary electrode layer (12), a secondary electrode layer (16) and a photovoltaic layer (14) arranged between said primary and said secondary electrode layer, at least one of the electrode layers being translucent, the photovoltaic layer (14) at least comprising a first sublayer of a photovoltaic material and a second, charge carrier transport sublayer between said first sublayer and said secondary electrode layer. An serial electrical interconnection between mutually subsequent photovoltaic modules (IB, 1C) is provided by a coupling element of insulating material laterally
(Continued)

enclosing an electrically conducting core (17BC) provided in the interface section between the mutually subsequent photovoltaic modules. Therewith a lifetime of the photovoltaic material is improved.

20 Claims, 8 Drawing Sheets

(56) References Cited

U.S. PATENT DOCUMENTS

| | | | |
|---|---|---|---|
| 2012/0048333 A1* | 3/2012 | Karpenko | H10F 19/35 |
| | | | 428/688 |
| 2013/0118569 A1 | 5/2013 | Lee et al. | |
| 2016/0133761 A1 | 5/2016 | Sasaki et al. | |
| 2017/0005211 A1* | 1/2017 | Reid | H01L 31/18 |
| 2019/0074461 A1* | 3/2019 | Ding | H10K 85/50 |

FOREIGN PATENT DOCUMENTS

| | | |
|---|---|---|
| WO | WO 2014/188092 A1 | 11/2014 |
| WO | WO 2018/088632 A1 | 5/2018 |

OTHER PUBLICATIONS

China National Intellectual Property Administration, Office Action in corresponding Chinese Application No. 202080050330.5 dated Oct. 28, 2023.

* cited by examiner

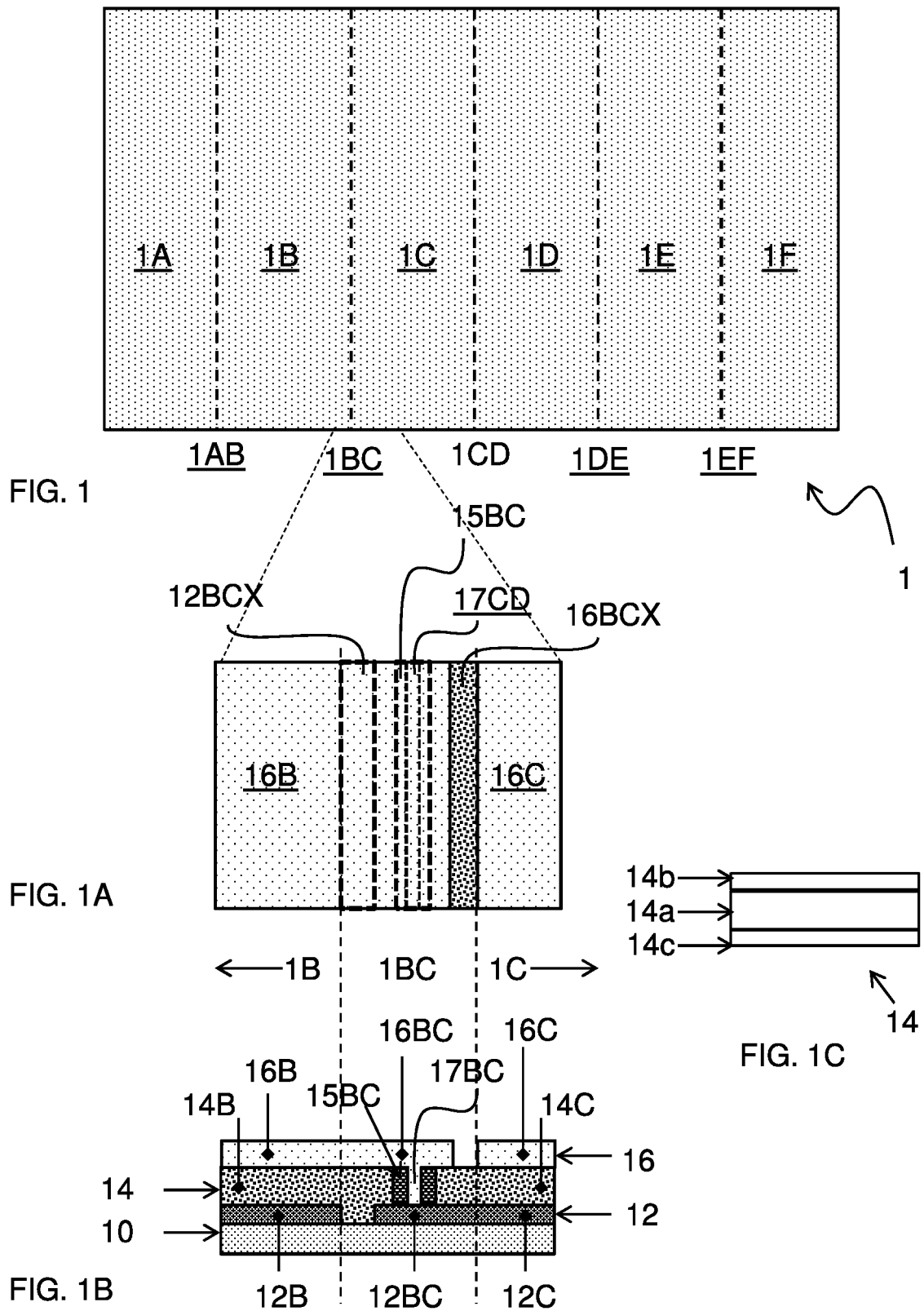

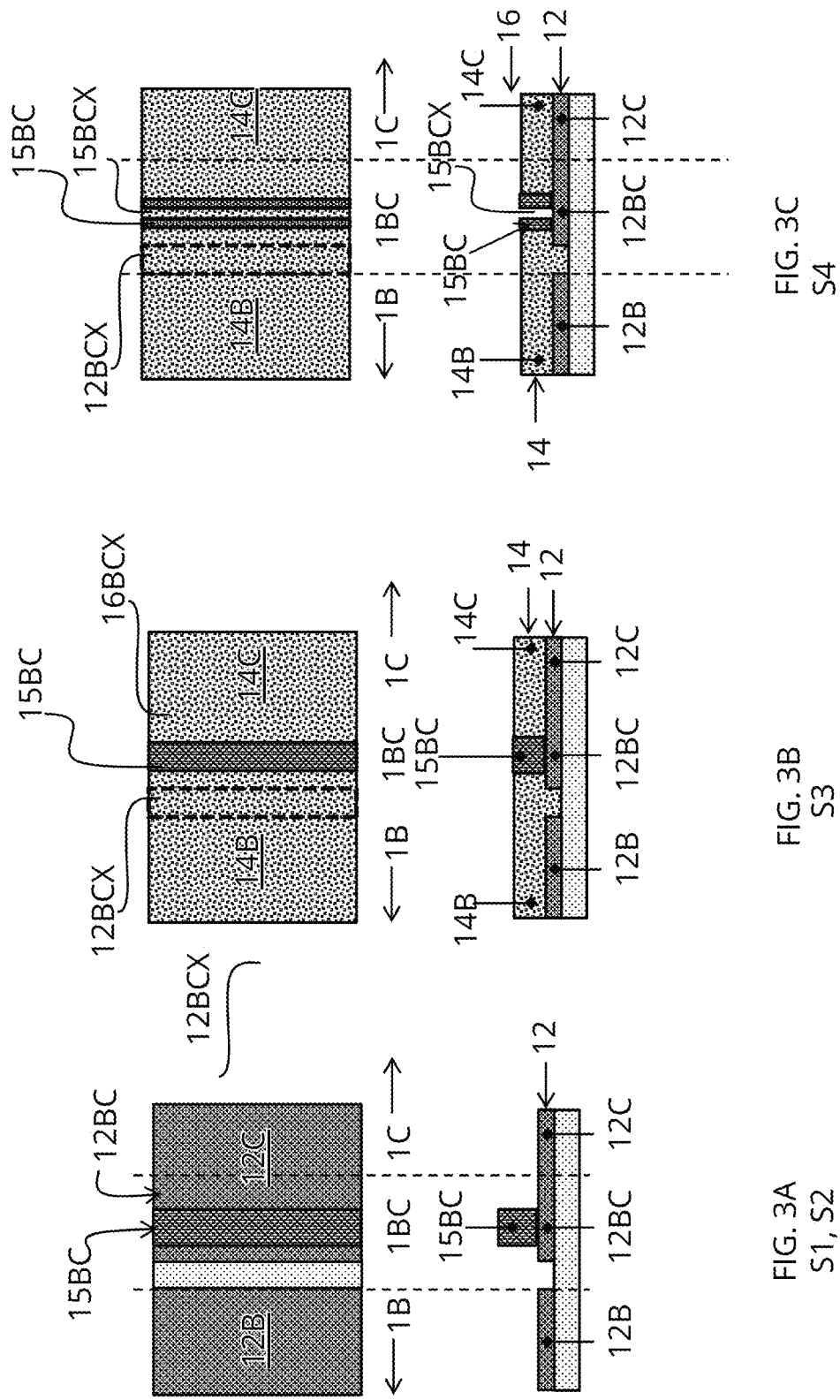

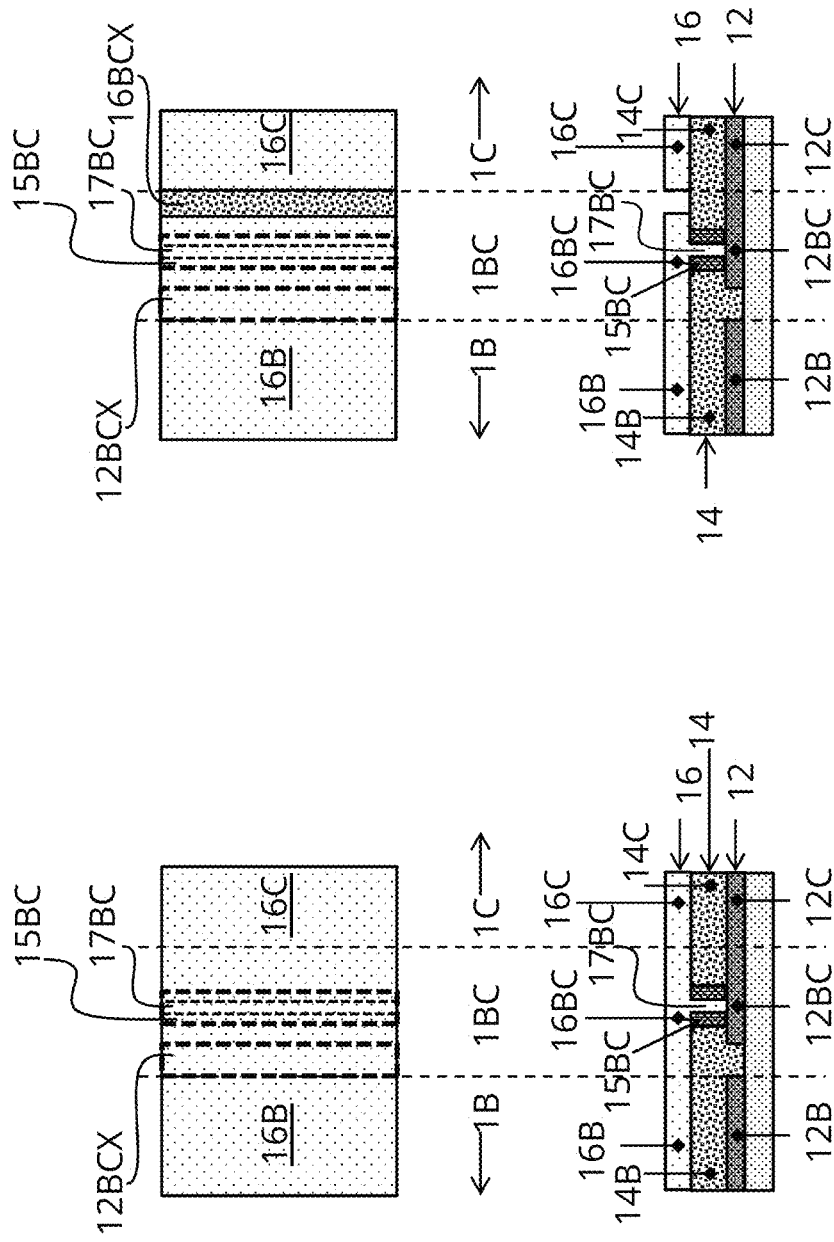

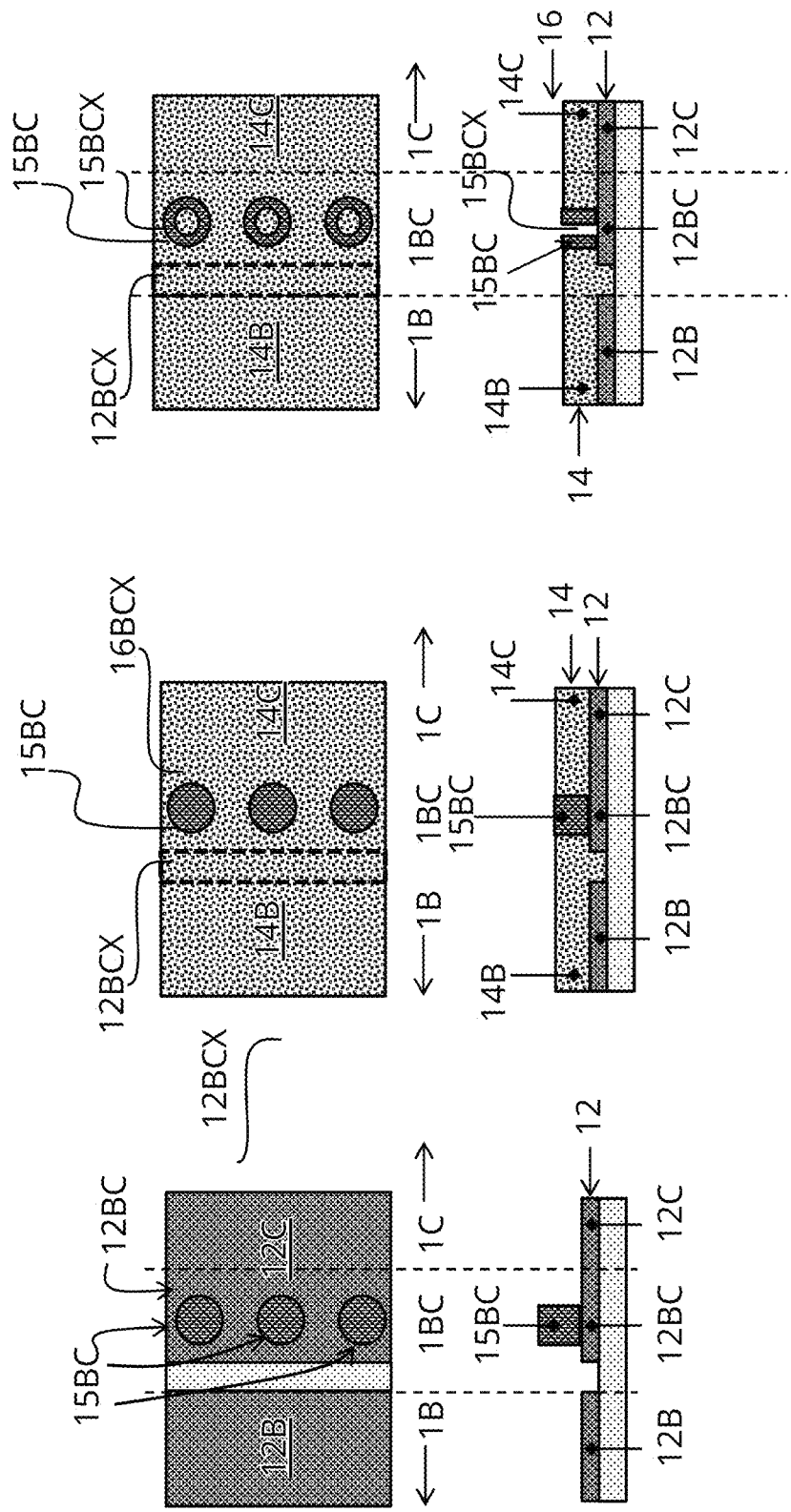

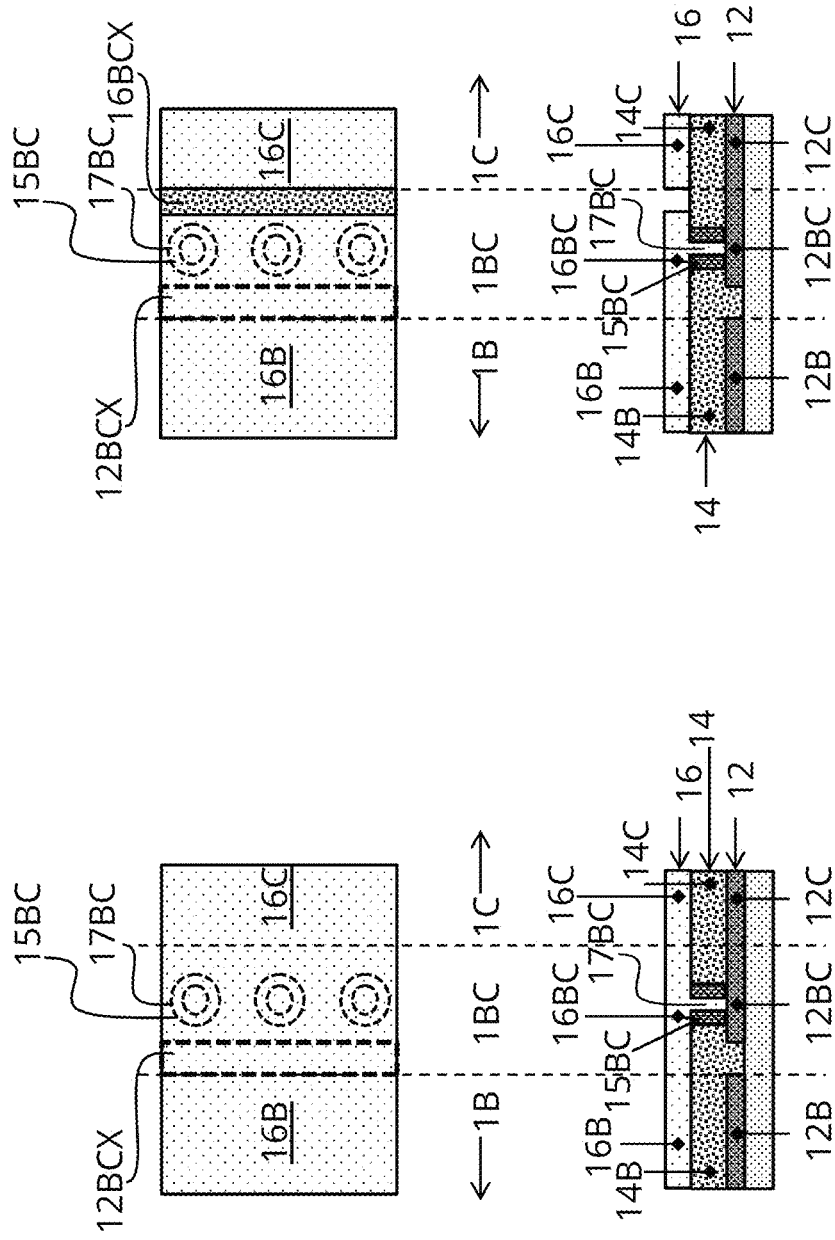

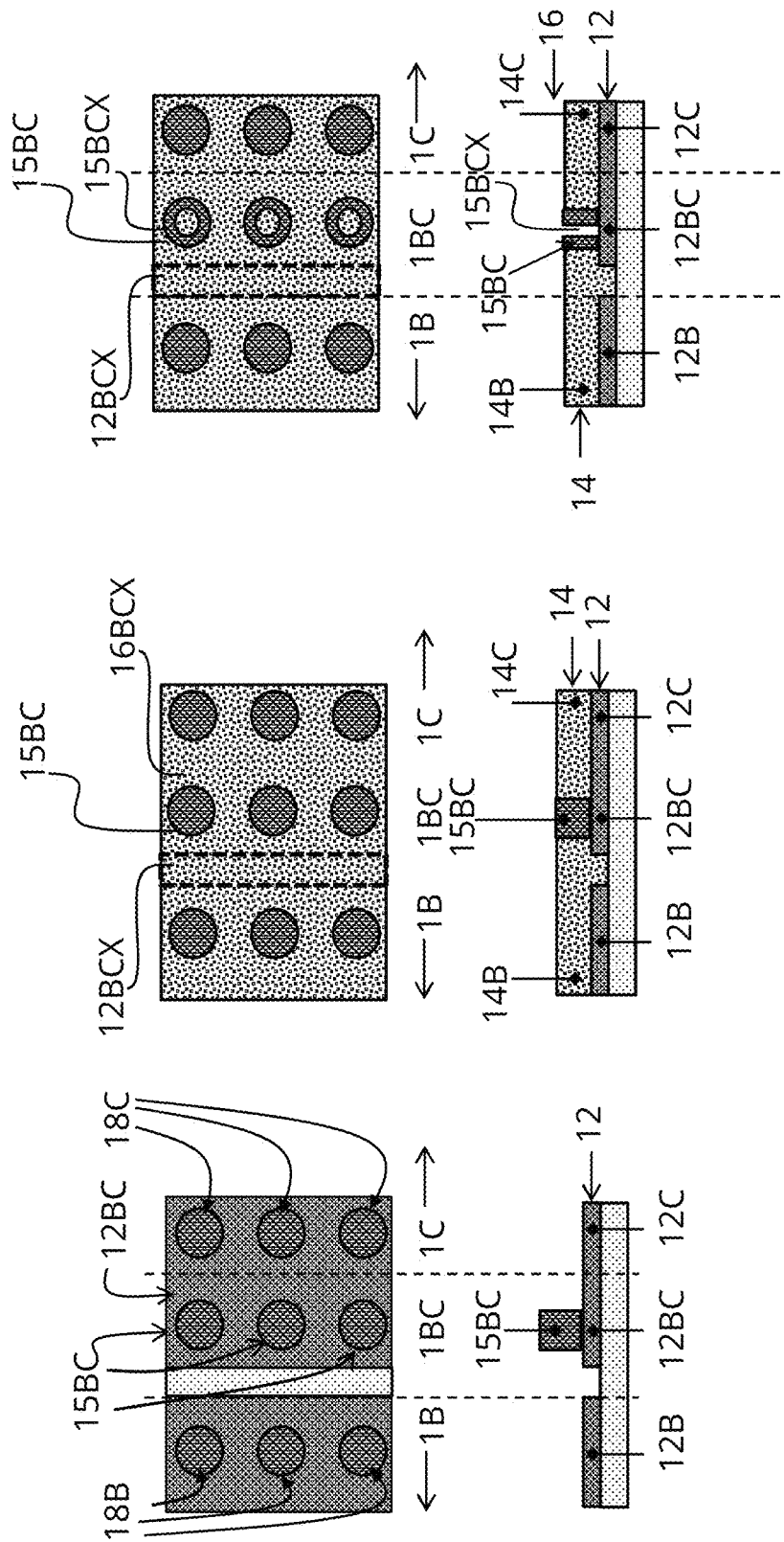

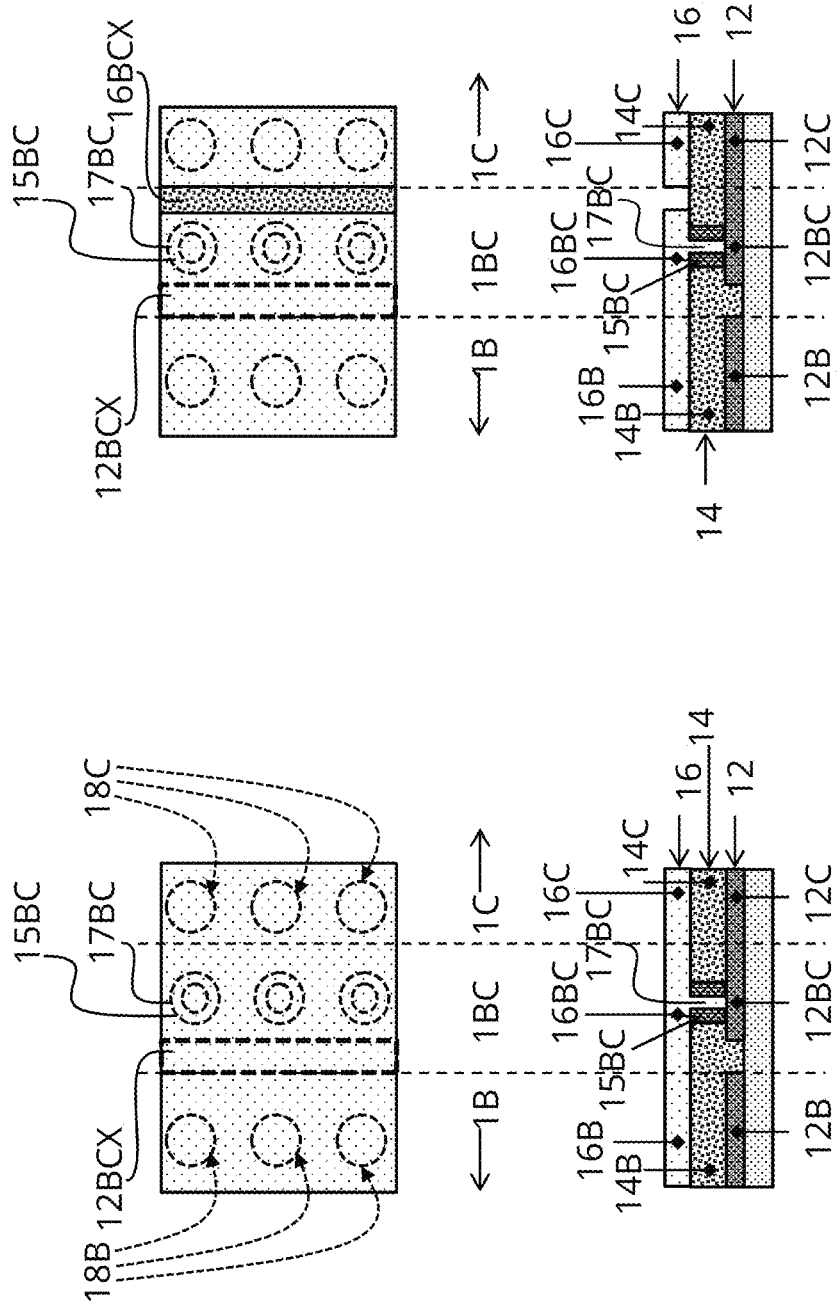

PHOTOVOLTAIC DEVICE AND METHOD OF MANUFACTURING THE SAME

CROSS-REFERENCE TO RELATED APPLICATIONS

This patent application is a U.S. National Phase of PCT International Application No. PCT/NL2020/050444, filed Jul. 8, 2020, which claims priority to European Application No. 19185397.7, filed Jul. 10, 2019, which are both expressly incorporated by reference in their entireties, including any references contained therein.

BACKGROUND

The present disclosure pertains to a photovoltaic device. The present disclosure further pertains to a method of manufacturing the same.

The photovoltaic device is formed with a laterally partitioned stack with a primary electrode layer, a secondary electrode layer and a photovoltaic layer arranged between the primary and the secondary electrode layer. It is noted that the wording "primary" and "secondary" are used herein merely serve to distinguish between the electrode layers of the photovoltaic device, and are not intended to indicate a ranking. I.e. instead of denoting these layers as "primary electrode layer" and "secondary electrode layer" they could be alternatively denoted as "secondary electrode layer" and "primary electrode layer" respectively. For example, the primary electrode layer and the secondary electrode layer may be either a cathode and an anode respectively, or may be an anode and a cathode respectively. It is further noted that layers in the stack may be composed of sub-layers stacked upon one another. Also further layers may be provided in addition to these essential layers specifically mentioned here.

The stack is laterally partitioned to form individual photovoltaic modules, which are to be serially interconnected. Therewith a higher voltage can be rendered, so that transport losses are reduced.

Perovskites form a promising group of photovoltaic materials, as they can be processed at relatively low temperatures and have a relatively high conversion efficiency. It is however a disadvantage of these materials that they react relatively easily with other materials or substances that are typically used in photovoltaic devices or typically occur in a manufacturing environment.

Accordingly there is a need to provide measures that at least mitigates a degradation of these materials in photovoltaic applications and their manufacturing methods.

SUMMARY

According to a first object an improved photovoltaic device is provided wherein a degradation of perovskite photovoltaic material during life-time is at least mitigated.

According to a second object an improved method for manufacturing a photovoltaic device is provided wherein a degradation of perovskite photovoltaic material is at least mitigated.

The improved photovoltaic device has a plurality of photovoltaic modules and comprises a stack with a primary electrode layer, a secondary electrode layer and a photovoltaic layer that is arranged between the primary and the secondary electrode layer. The photovoltaic layer comprises at least comprising a first sublayer of a photovoltaic material and a second, charge carrier transport sublayer between the first sublayer and the secondary electrode layer.

At least one of the electrode layers is translucent to enable light to reach the photovoltaic layer. Preferably therewith at least 50%, even more preferably at least 75%, and still more preferably at least 90% of incident light in the spectrum for which the photovoltaic layer is sensitive is transmitted. Preferably, the translucent layers are transparent. Also a substrate on which the stack is arranged may be transparent if necessary.

Each photovoltaic module has a portion of a respective section of the primary electrode layer, a portion of a respective section of the photovoltaic layer and a portion of a respective section of the secondary electrode layer (16).

Respective pairs of a first photovoltaic module and a subsequent second photovoltaic module of the plurality of photovoltaic modules are serially interconnected in an interface section between the first photovoltaic module and the second photovoltaic module of the pair. The serial interconnection is provided in that the interface section comprises a coupling element of insulating material laterally enclosing an electrically conducting core. The coupling element is sandwiched between a second end of the secondary electrode layer section of the first photovoltaic module and a first end of the primary electrode layer section of the subsequent, second photovoltaic module of the pair. The second end of the secondary electrode layer section of the first photovoltaic module laterally extends over a first face of the electrically conducting core and the first end of the primary electrode layer section of the subsequent second photovoltaic module of the pair laterally extends over a second face of the electrically conducting core. Therewith an electrical connection is formed between the second end of the secondary electrode layer section of the first photovoltaic module and the first end of the primary electrode layer section of the subsequent second photovoltaic module via the electrically conducting core.

The improved photovoltaic device can be manufactured with an improved method, provided herewith. The improved method comprising the following steps:

providing a primary electrode layer which is partitioned into a plurality of primary electrode layer sections, the primary electrode layer section having a first end having a surface which is at least partly covered with an insulating material portion;

providing a photovoltaic layer on a remaining surface free from said insulating material, the photovoltaic layer at least comprising a first sublayer of a photovoltaic material and a second, charge carrier transport sublayer between said first sublayer and said secondary electrode layer;

providing an opening in said insulating material portion to locally expose the surface of the first end of the primary electrode layer section and deposit an electrically conductive material in said opening;

providing a secondary electrode layer, to form an electrical connection with the first end of the primary electrode layer section via said electrically conductive material in said opening;

partitioning the secondary electrode layer into a plurality of secondary electrode layer sections, each secondary electrode layer section overlapping.

The presence of the second, charge carrier transport sublayer between the first sublayer of a photovoltaic material and the secondary electrode layer prevents a direct contact between the material of the photovoltaic layer and the material of the secondary electrode layer.

The electrically conductive material in the opening of the insulating material portion may be the same as the electrically conductive material used for the secondary electrode layer. In particular, deposition of an electrically conductive material in the opening may be achieved during the step of providing the secondary electrode layer by depositing the electrically conductive material used for the second electrode layer also into the opening of the insulating material portion.

In any case, the insulating material portion and the electrically conductive material deposited into the opening thereof form a coupling element wherein the electrically conductive material forms an electrically conducting core and the insulating material portion laterally encloses the core. Therewith a physical contact between the photovoltaic sublayer and the electrically conductive material used for the serial interconnection is avoided. Therewith a degradation of perovskite photovoltaic materials is mitigated. Although perovskite materials are preferred for the reasons specified above, also other materials are suitable, for example copper indium gallium selenide (CIGS).

In an embodiment the at least one coupling element extends along the section. Alternatively, the at least one coupling element may be one of a plurality of similar coupling elements. Therewith the similar coupling elements may be distributed along a length direction of the interface section, so that light can pass at locations between the coupling elements. For an even better light transmission in the interface section, the insulating material maybe translucent as well as the material used for both electrode layers and the substrate.

A respective set of translucent, insulating elements may be provided that are laterally distributed between the portion of the primary electrode layer section and the portion of the secondary electrode layer section of each photovoltaic module. Therewith it is made possible that light is partially transmitted through these translucent, insulating elements and is partially converted into electricity in the remaining surface of the photovoltaic layer.

BRIEF DESCRIPTION OF THE DRAWINGS

These and other aspects are described in more detail with reference to the drawings. Therein:

FIG. 1 schematically shows an embodiment of a photovoltaic device according to the present disclosure, FIG. 1A schematically shows an enlarged portion of the photovoltaic device of FIG. 1, FIG. 1B schematically shows a cross-section through this portion and FIG. 1C shows in more detail a cross-section through the photovoltaic layer of this photovoltaic device;

FIG. 3A-3E schematically show an embodiment of a method according to the present disclosure;

FIG. 4A-4E show another embodiment of a method according to the present disclosure;

FIG. 5A-5E show a still further embodiment of a method according to the present disclosure.

DETAILED DESCRIPTION OF EMBODIMENTS

Figure 2A:
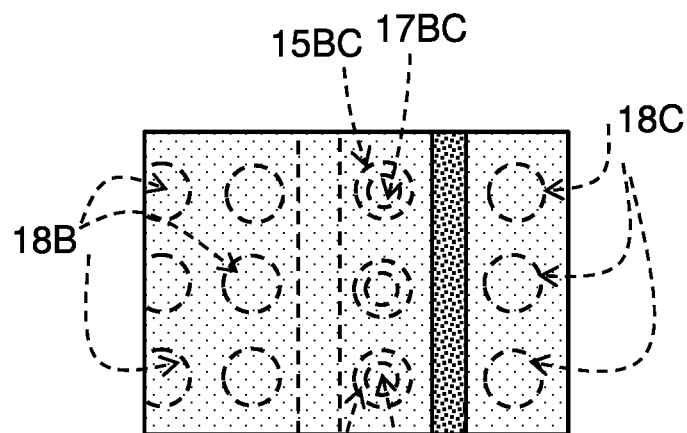
FIG. 2A schematically shows an enlarged portion of another embodiment of the photovoltaic device according to the present disclosure, and FIG. 2B schematically shows a cross-section through this portion.

FIG. 1 schematically shows a photovoltaic device 1 with a plurality of photovoltaic modules 1A, 1B, . . . , 1F. FIG. 1A schematically shows an enlarged portion of the photovoltaic device 1 in the neighborhood of an interface section 1BC between the photovoltaic module 1B and the succeeding photovoltaic module 1C. FIG. 1B schematically shows a cross-section through this portion of the photovoltaic device 1, and FIG. 1C shows in more detail a cross-section through the photovoltaic layer.

As shown in more detail in FIG. 1B, the photovoltaic device 1 comprises a stack with a primary electrode layer 12, a secondary electrode layer 16 and a photovoltaic layer 14 arranged between the first and the secondary electrode layer. The stack may be provided on a substrate 10 of a glass or a resin base material. Such resin base materials preferably include polyethylene terephthalate (PET), polyethylene naphthalate (PEN), polyimide (PI), polyetherimide (PEI), polyethersulfone (PES), polysulfone (PSF), polyphenylene sulfide (PPS), polyether ether ketone (PEEK), polyarylate (PAR), and polyamide-imide (PAI). Other resin materials include polycycloolefin resin, acrylic resin, polystyrene, ABS, polyethylene, polypropylene, polyamide resin, polyvinyl chloride resin, polycarbonate resin, polyphenyleneether resin and cellulose resin, etc. Dependent on the application a thickness of the substrate may be selected in the range of a relatively small value e.g. 50 micron and a relatively large value, e.g. a few mm or more. It is not necessary that the substrate is transparent, provided that light can access the photo-voltaic layer from a side of the photovoltaic device opposite the substrate. In that case it may further be contemplated to use an (electrically insulated) metal foil as the substrate.

The photovoltaic device 1 is at least partially translucent so as to enable light to reach the photovoltaic layer 14 from outside the photovoltaic device. Hence at least one of the electrode layers is translucent. Examples of transparent electrically conductive materials are organic materials such as polyaniline, polythiophene, polypyrrole or doped polymers. Apart from organic materials, various inorganic transparent, electrically conducting materials are available like ITO (Indium Tin Oxide), IZO (Indium Zinc Oxide), ATO (Antimony Tin Oxide), or Tin Oxide can be used. Other metal oxides can work, including but not limited to Nickel-Tungsten-Oxide, Indium doped Zinc Oxide, Magnesium-Indium-Oxide. The transparent electrically conductive electrode layer may have a thickness in the range of a few tens of nm to a few hundreds of nm, for example in a range between 100 and 200 nm, for example about 120 nm. Also (combinations of) a thin metal layer, an oxide layer, or other e.g. a TCO or a metal oxide layer or a conducting polymer layer, such as PEDOT-PSS may be used. For example a 7 nm layer of Silver may be sandwiched in between two 10 nm ITO layers. As the electrical conductivity of a transparent electrode layer is relatively low it may be shunted by electrical conductors, these may be formed as a grid on the transparent electrode layer.

It is not necessary that both electrode layers are transparent. The non-transparent electrode layer can have a relatively large thickness so that no concessions need to be made in regard to the conductivity. A non transparent electrode layer may for example be formed of a layer of suitably conductive material, like aluminum, silver or copper. Also the non-transparent electrode layer, may be provided as a combination of sub layers, e.g. a relative thick main sub layer of an above-mentioned suitably conductive material, e.g. having a thickness of 100 to a few 100 nm or more and a relatively thin interface sub layer at one or both faces of the main sub layer, e.g. a sub layer of a few nm of Mo or Ni.

As shown schematically in FIG. 1C, the photovoltaic layer 14 at least comprises a first sublayer 14a of a photovoltaic material and a second, charge carrier transport sublayer 14b between the first sublayer 14a and the secondary electrode layer 16. Also further sublayers, such as another charge carrier transport sublayer 14c may be present.

Examples of hole transport materials for a hole transport layer have been summarized for example, in Kirk-Othmer Encyclopedia of Chemical Technology, Fourth Edition, Vol. 18, p. 837-860, 1996, by Y. Wang. Both hole transporting molecules and polymers can be used. Typical examples for this purpose are metal oxides, like nickel oxide, and other compounds, like MoSe. In an embodiment a hole transport sub layer, may have a thickness in the range of 10 to 200 nm. An electron transport sub layer may be formed of a metal oxide, like $TiO_2$, $SnO_2$, $ZrO_2$ and $ZnO:S$. The electron transport sub layer may have a thickness in the range of a few nm, e.g. 5 nm to a few tens of nm.

As noted above, perovskite photovoltaic materials are an important class of materials for use in a photo-voltaic sublayer 14a, as these materials can be processed at relatively low temperatures, and yet have a conversion efficiency that comes close to that achieved with silicon based photo-voltaic devices. In an embodiment the photo-electric conversion layer is provided of a perovskite material. Perovskite materials typical have a crystal structure of $ABX_3$, wherein A is an organic cation as methylammonium $(CH_3NH_3)+$, B is an inorganic cation, usually lead (II) $(Pb^{2+})$, and X is a halogen atom such as iodine (I—), chlorine (Cl—), fluorine (F—) or bromine (Br—). Perovskite materials are particularly advantageous in that they can be processed relatively easily and in that their bandgap can be set to a desired value by a proper choice of the halide content. One of examples is methylammonium lead trihalide $(CH_3NH_3PbX_3)$, with an optical bandgap between 1.5 and 2.3 eV depending on halide content. Other more complex structures contain mixed A cations, such as Cesium (Cs+), methylammonium $((CH_3NH_3)+$, MA), formamidinum $((H_2NCHNH_2)+$, FA), or rubidium (Rb+) and mixed X anions. The examples of complex mixed perovskites are Cesium formamidinum lead trihalide $Cs_xFA_{1-x}PbI_yBr_{3-y}$ and Cesium Methylamonium formamidinum lead trihalide $Cs_xMA_zFA_{1-x-z}PbI_yBr_{3-y}$ (where x<1, z<1, x+z<1). With the A-cations and X-anions ratio the bandgap and the physical properties of perovskite materials can be tuned. Other metals such as tin may replace the role of Pb in the B position of perovskite materials. An example thereof is $CH_3NH_3SnI_3$. Also combinations of Sn with Pb perovskites having a wider bandgap in the range of 1.2 to 2.2 eV are possible.

Each photovoltaic module has a portion of a respective section of the primary electrode layer, a portion of a respective section of the photovoltaic layer and a portion of a respective section of the secondary electrode layer. In FIG. 1A, 1B it is shown that photovoltaic module 1B has a portion of a section 12B of the primary electrode layer 12, a portion of a section 14B of the photovoltaic layer 14 and a portion of a section 16B of the secondary electrode layer 16. As further shown therein, photovoltaic module 1C has a portion of a section 12C of the primary electrode layer 12, a portion of a section 14C of the photovoltaic layer 14 and a portion of a section 16C of the secondary electrode layer 16.

Mutually subsequent photovoltaic modules are serially interconnected in their interface section. As shown in FIG. 1A, 1B the interface section 1BC comprises a coupling element 15BC of an insulating material that laterally encloses an electrically conducting core 17BC. The coupling element 15BC is sandwiched between a second end 16BC of the secondary electrode layer section 16B of the first photovoltaic module 1B and a first end 12BC of the primary electrode layer section 12C of the subsequent second photovoltaic module 1C. The second end 16BC of the secondary electrode layer section 16B laterally extends over a first face of the electrically conducting core 17BC and the first end 12BC of the primary electrode layer section 12C of the subsequent second photovoltaic module 1C laterally extends over a second face of the electrically conducting core 17BC. Therewith the photovoltaic modules an electrical connection is formed between the second end 16BC of the secondary electrode layer section 16B and the first end 12BC of the primary electrode layer section 12C via the electrically conducting core 17BC.

In the embodiment shown in FIG. 1, 1A, 1B, the electrically conducting core 17BC and the secondary electrode layer 16 are formed with a same electrically conductive material.

In the embodiment shown in FIG. 1, 1A, 1B, the coupling element 15BC extends along the interface section 1BC.

Figure 2B:
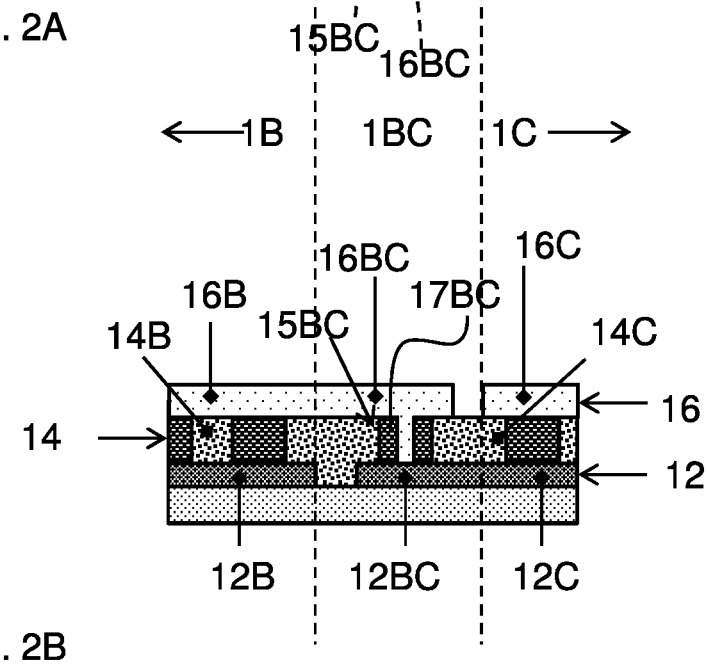

An alternative embodiment is shown in FIG. 2A, 2B. Therein FIG. 2A is a top-view of the alternative embodiment corresponding to the FIG. 1A, and FIG. 2B is a cross-sectional view of the alternative embodiment corresponding to FIG. 1B. In this alternative embodiment the coupling element 15BC is one of a plurality of similar elements 15BC that are distributed along a length direction of the interface section 1BC.

The insulating material used for the hollow coupling element 15BC as well as the material used for the electrode layers may be translucent. Therewith it is achieved that light which is not absorbed by the photovoltaic layer is transmitted by the photovoltaic modules and that light is also partly transmitted in the interface section 1BC. This is for example advantageous for application of the photovoltaic device as a roof, when it is desired that the roof is not fully opaque. Such devices are also very suitable for application in other construction elements requiring transparency, such as windows.

The embodiment of the photovoltaic device as shown in FIG. 2A, 2B further comprises translucent, insulating elements 18B, 18C that are laterally distributed in the area of the photovoltaic modules between their portion of the primary electrode layer section 12B, 12C and their portion of the secondary electrode layer section 16B, 16C. The translucent, insulating elements 18B, 18C therewith partially replace the material of the photovoltaic layer 14, so that more light can be transmitted through the photovoltaic device. As these insulating elements 18B, 18C are laterally distributed, a homogeneous illumination of a space below the photovoltaic device can be achieved.

FIG. 3A-3E schematically show a method of manufacturing a photovoltaic device 1 with a plurality of photovoltaic modules 1A, 1B, . . . , 1F.

As shown in FIG. 3A, the method comprises providing a primary electrode layer 12 which is partitioned into a plurality of primary electrode layer sections 12B, 12C. The primary electrode layer section 12C has a first end 12BC with a surface that is at least partly covered with an insulating material portion 15BC. In this embodiment of the method, a single insulating material portion 15BC extends along an interface section between mutually subsequent photovoltaic modules to be formed. The semi-finished product as shown in FIG. 3A for example may be obtained by first providing (S1) the partitioned primary electrode layer 12, and subsequently depositing (S2) the insulating material portions 15BC. The layer 12 may be deposited blanket-wise and be subsequently partitioned into primary electrode layer sections 12B, 12C, e.g. by a photolithography or by scribing, e.g. laser scribing. Alternatively, the layer may be deposited directly as primary electrode layer sections 12B, 12C, for example by masked deposition by printing. The semi-finished product as shown in FIG. 3A for example may be obtained by first providing the partitioned primary electrode layer 12, and subsequently depositing the insulating material portions 15BC. In an other embodiment, the layer 12 is partitioned after deposition of the insulating material portions.

In a subsequent step S3, shown in FIG. 3B, a photovoltaic material is provided on a remaining surface free from said insulating material. Therewith a photovoltaic layer 14 is obtained which has photovoltaic layer sections 14B, 14C, that each substantially overlap a respective primary electrode layer section 12B, 12C.

As shown in FIG. 3C, in further step S4 an opening 15BCX is provided in the insulating material portion 15BC to locally expose the surface of the first end 12BC of the primary electrode layer section (12B).

As shown in FIG. 3D, in still further step S5 a secondary electrode layer 16 is deposited. As a result of this deposition step S5, material of the secondary electrode layer also protrudes the opening 15BCX in the insulating material portion 15BC and therewith forms an electrical connection with the first end 12BC of the primary electrode layer section 12B.

FIG. 3E shows a further step S6, wherein the secondary electrode layer 16 is partitioned into a plurality of secondary electrode layer sections 16B, 16C. Each secondary electrode layer section 16B, 16C substantially overlaps a respective photovoltaic layer sections 14B, 14C. Therewith a plurality of photovoltaic modules is formed that each have a portion of a respective section of the primary electrode layer 12, a portion of a respective section of the photovoltaic layer 14 and a portion of a respective section of the secondary electrode layer 16.

FIG. 4A-4E show an alternative embodiment of the method. This embodiment differs from the embodiment shown in FIG. 3A-3E as follows.

FIG. 4A, illustrating steps S1A, S2A of the alternative embodiment, shows that, contrary to the previously discussed embodiment a plurality of insulating material portions 15BC is distributed along a length direction in an interface section between mutually subsequent photovoltaic modules to be formed. In FIG. 4A, the trenches 12BCX in the primary electrode layer 12 extend linearly, but they may alternatively be provided in a meandering manner for a reduced visibility. Subsequent step S3A, shown in FIG. 4B, substantially corresponds to step S3 shown in FIG. 3B, in that a photovoltaic material is provided on a remaining surface free from said insulating material.

In further step S4A shown in FIG. 4C, an opening 15BCX is provided in each of the insulating material portions 15BC to locally expose the surface of the first end 12BC of the primary electrode layer section 12B.

FIG. 4D shows a further step S5A corresponding to step S5 shown in FIG. 3D, in that a secondary electrode layer 16 is deposited. However, in this case, material of the secondary electrode layer also protrudes the openings 15BCX in the insulating material portions 15BC. The protruding material therewith forms an electrical connection with the first end 12BC of the primary electrode layer section 12B at mutually distributed positions.

Still further step S6A, shown in FIG. 4E corresponds to step S6, in that the secondary electrode layer 16 is partitioned into a plurality of secondary electrode layer sections 16B, 16C. In FIG. 4E, the trenches 16BCX in the secondary electrode layer 16 extend linearly, but they may alternatively be provided in a meandering manner for a reduced visibility.

FIG. 5A-5E show an further alternative embodiment of the method. This embodiment differs from the embodiment shown in FIG. 4A-4E as follows.

Steps S1B, S2B, shown in FIG. 5A differ from steps S1A, S2A, shown in FIG. 4A, in that additional insulating material portions 18B, 18C are provided on the primary electrode layer 12 in the area of the photovoltaic modules to be formed.

Subsequent step S3B, shown in FIG. 5B, substantially corresponds to step S3A shown in FIG. 4B, in that a photovoltaic material is provided on a remaining surface free from said insulating material. This implies that the translucent, insulating elements 18B, 18C therewith partially replace the material of the photovoltaic layer 14.

As in step S4A (FIG. 4C), in step S4B, shown in FIG. 5C, an opening 15BCX is provided in each of the insulating material portions 15BC to locally expose the surface of the first end 12BC of the primary electrode layer section 12B. This process is not applied to the additional insulating material portions 18B, 18C. In FIG. 5A, the trenches 12BCX in the primary electrode layer 12 extend linearly, but they may alternatively be provided in a meandering manner for a reduced visibility.

FIG. 5D shows a further step S5B corresponding to step S5A shown in FIG. 4D, in that a secondary electrode layer 16 is deposited. As in step S5A, therewith material of the secondary electrode layer also protrudes the openings 15BCX in the insulating material portions 15BC. The protruding material therewith forms an electrical connection with the first end 12BC of the primary electrode layer section 12B at mutually distributed positions.

Still further step S6B, shown in FIG. 5E, corresponds to step S6A, in that the secondary electrode layer 16 is partitioned into a plurality of secondary electrode layer sections 16B, 16C. In FIG. 5E, the trenches 16BCX in the secondary electrode layer 16 extend linearly, but they may alternatively be provided in a meandering manner for a reduced visibility. As the translucent, insulating elements 18B, 18C replace the material of the photovoltaic layer 14 at laterally distributed positions, a portion of the light impinging on the photovoltaic device is transmitted through these translucent, insulating elements 18B, 18C. Despite the absence of photovoltaic material at these positions, the secondary electrode layer 16 preferably extends over the additional insulating material portions 18B, 18C to contribute to a lateral conductivity of the secondary electrode layer 16.

The invention claimed is:

1. A photovoltaic device with a plurality of photovoltaic modules, comprising:
    a stack including:
        a primary electrode layer,
        a secondary electrode layer, and
        a photovoltaic layer arranged between the primary electrode layer and the secondary electrode layer,
        wherein the primary electrode layer and/or the secondary electrode layer is translucent,
        wherein the photovoltaic layer comprises:
            a first sublayer of a photovoltaic material, and
            a second sublayer for charge carrier transport, the second sublayer being between the first sublayer and the secondary electrode layer;
    wherein each photovoltaic module includes:
        a portion of a respective section of the primary electrode layer, a portion of a respective section of the photovoltaic layer, and a portion of a respective section of the secondary electrode layer, wherein respective pairs, of a first photovoltaic module and a subsequent second photovoltaic module, of the plurality are serially interconnected in an interface section between the first photovoltaic module and the second photovoltaic module, wherein the interface section comprises a coupling element of insulating material laterally enclosing an electrically conducting core, wherein the coupling element is sandwiched between:
a second end of the secondary electrode layer section of the first photovoltaic module that laterally extends over, and forms an electrical connection with a first face, of the electrically conducting core, and
a first end of the primary electrode layer section of the subsequent second photovoltaic module that laterally extends over, and forms an electrical connection with a second face of the electrically conducting core, wherein a trench is provided in a meandering manner along a direction of the interface section between mutually subsequent sections of:
the primary electrode layer, and/or
the secondary electrode layer.

2. The photovoltaic device according to claim 1, wherein the insulating material is translucent, and wherein both the primary electrode layer and the secondary electrode layer are translucent.

3. The photovoltaic device according to claim 2, wherein the electrically conducting core and the secondary electrode layer are formed with a same electrically conductive material.

4. The photovoltaic device according to claim 3, wherein the at least one coupling element extends along the interface section.

5. The photovoltaic device according to claim 3, wherein the at least one coupling element is one of a plurality of similar coupling elements, where ones of the similar coupling elements are distributed along a length direction of the interface section.

6. The photovoltaic device according to claim 3, comprising a respective set of translucent, insulating elements that are laterally distributed, for each photovoltaic module between:
the portion of the primary electrode layer section, and
the portion of the secondary electrode layer section.

7. The photovoltaic device according to claim 2, wherein the at least one coupling element extends along the interface section.

8. The photovoltaic device according to claim 7, wherein the at least one coupling element is one of a plurality of similar coupling elements, where ones of the similar coupling elements are distributed along a length direction of the interface section.

9. The photovoltaic device according to claim 2, wherein the at least one coupling element is one of a plurality of similar coupling elements, where ones of the similar coupling elements are distributed along a length direction of the interface section.

10. The photovoltaic device according to claim 2, comprising a respective set of translucent, insulating elements that are laterally distributed, for each photovoltaic module between:
the portion of the primary electrode layer section, and
the portion of the secondary electrode layer section.

11. The photovoltaic device according to claim 1, wherein the electrically conducting core and the secondary electrode layer are formed with a same electrically conductive material.

12. The photovoltaic device according to claim 11, wherein the at least one coupling element extends along the interface section.

13. The photovoltaic device according to claim 12, wherein the at least one coupling element is one of a plurality of similar coupling elements, where ones of the similar coupling elements are distributed along a length direction of the interface section.

14. The photovoltaic device according to claim 11, wherein the at least one coupling element is one of a plurality of similar coupling elements, where ones of the similar coupling elements are distributed along a length direction of the interface section.

15. The photovoltaic device according to claim 11, comprising a respective set of translucent, insulating elements that are laterally distributed, for each photovoltaic module between:
the portion of the primary electrode layer section, and
the portion of the secondary electrode layer section.

16. The photovoltaic device according to claim 1, wherein the at least one coupling element extends along the interface section.

17. The photovoltaic device according to claim 16, wherein the at least one coupling element is one of a plurality of similar coupling elements, where ones of the similar coupling elements are distributed along a length direction of the interface section.

18. The photovoltaic device according to claim 1, wherein the at least one coupling element is one of a plurality of similar coupling elements, where ones of the similar coupling elements are distributed along a length direction of the interface section.

19. The photovoltaic device according to claim 1, comprising a respective set of translucent, insulating elements that are laterally distributed, for each photovoltaic module between:
the portion of the primary electrode layer section, and
the portion of the secondary electrode layer section.

20. A method of manufacturing a photovoltaic device with a plurality of photovoltaic modules, wherein respective pairs of a first photovoltaic module and a subsequent second photovoltaic module, of the plurality of photovoltaic modules, are serially interconnected in an interface section between the first photovoltaic module and the second photovoltaic module, the method comprising:
providing a primary electrode layer that is partitioned into a plurality of primary electrode layer sections, the primary electrode layer section having a first end having a surface that is at least partly covered with an insulating material portion;
providing a photovoltaic layer on a remaining surface free from the insulating material, the photovoltaic layer at least comprising a first sublayer of a photovoltaic material and a second sublayer for charge carrier transport, the second sublayer being between the first sublayer and the secondary electrode layer;
providing an opening in the insulating material portion to locally expose the surface of the first end of the primary electrode layer section, and depositing an electrically conductive material in the opening in the insulating material portion;
providing a secondary electrode layer, material of the secondary electrode layer therewith protruding at the opening of the insulating material portion to form an electrical connection with the first end of the primary electrode layer section;

partitioning the secondary electrode layer into a plurality of secondary electrode layer sections, each secondary electrode layer section being overlapping across serially connected ones of the plurality of photovoltaic modules, and providing a trench in a meandering manner along a direction of the interface section between mutually subsequent sections of:
  the primary electrode layer, and/or
  the secondary electrode layer.

\* \* \* \* \*